(12) United States Patent
Huo

(10) Patent No.: US 10,088,930 B2
(45) Date of Patent: Oct. 2, 2018

(54) ACTIVE MATRIX ORGANIC LIGHT EMITTING DIODE IN-CELL TOUCH PANEL AND DRIVE METHOD THEREOF

(71) Applicant: Shanghai Tianma Micro-Electronics Co., Ltd., Shanghai (CN)

(72) Inventor: Sitao Huo, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 144 days.

(21) Appl. No.: 15/225,754

(22) Filed: Aug. 1, 2016

(65) Prior Publication Data
US 2016/0378233 A1 Dec. 29, 2016

Related U.S. Application Data

(63) Continuation-in-part of application No. 14/353,005, filed as application No. PCT/CN2012/081426 on Sep. 14, 2012, now Pat. No. 9,442,330.

(30) Foreign Application Priority Data

Nov. 25, 2011 (CN) .......................... 2011 1 0383654

(51) Int. Cl.
| | |
|---|---|
| G06F 3/041 | (2006.01) |
| G06F 3/044 | (2006.01) |
| H01L 27/32 | (2006.01) |
| H01L 51/52 | (2006.01) |
| G02F 1/1333 | (2006.01) |
| G02F 1/1343 | (2006.01) |

(52) U.S. Cl.
CPC ............ G06F 3/0412 (2013.01); G06F 3/044 (2013.01); H01L 27/323 (2013.01); H01L 27/3276 (2013.01); H01L 51/5225 (2013.01); G02F 1/13338 (2013.01); G02F 2001/134318 (2013.01); G06F 2203/04111 (2013.01)

(58) Field of Classification Search
CPC .................. G06F 3/0412; G06F 3/044; G06F 2203/04111; G06F 2203/04112; G06F 2203/04103; H01L 27/3225; H01L 27/323; H01L 51/5225; G09G 3/32; G02F 1/13338; G02F 1/1333; G02F 1/134336; G02F 2001/134318
See application file for complete search history.

(56) References Cited

U.S. PATENT DOCUMENTS

| | | | |
|---|---|---|---|
| 2011/0181519 A1* | 7/2011 | Tsai | G06F 3/0412 345/173 |
| 2013/0050130 A1* | 2/2013 | Brown | G06F 3/044 345/174 |

(Continued)

Primary Examiner — Darlene M Ritchie
(74) Attorney, Agent, or Firm — Alston & Bird LLP

(57) ABSTRACT

An AMOLED panel is provided. A cathode of the AMOLED panel is patterned into rows of first electrodes and columns of second electrodes, two adjacent first electrodes in the same row are electrically connected with each other, and two adjacent second electrodes in the same column are electrically connected to a conductive line in a different layer via plugs. The rows receive driving signals sequentially and the columns generate sensing signals for detecting proximity of an external conductive object.

18 Claims, 13 Drawing Sheets

(56) References Cited

U.S. PATENT DOCUMENTS

| | | | | |
|---|---|---|---|---|
| 2013/0162549 A1* | 6/2013 | Kim | ................... | G06F 3/0412 345/173 |
| 2014/0118642 A1* | 5/2014 | Wang | ................ | G02F 1/13338 349/12 |
| 2014/0253473 A1* | 9/2014 | Kim | ................... | G06F 3/0416 345/173 |
| 2015/0362776 A1* | 12/2015 | Jikumaru | ............. | H01L 27/124 349/12 |
| 2016/0132281 A1* | 5/2016 | Yamazaki | ............ | G06F 3/1446 345/1.3 |
| 2017/0177125 A1* | 6/2017 | Kim | ................... | G06F 3/0412 |
| 2017/0185194 A1* | 6/2017 | Kim | ................... | G06F 3/0412 |
| 2017/0269762 A1* | 9/2017 | Xu | ...................... | G06F 3/0416 |
| 2017/0278916 A1* | 9/2017 | Maruyama | ......... | H01L 27/3276 |
| 2017/0358637 A1* | 12/2017 | Lee | ..................... | G06F 3/0412 |

\* cited by examiner

ACTIVE MATRIX ORGANIC LIGHT EMITTING DIODE IN-CELL TOUCH PANEL AND DRIVE METHOD THEREOF

CROSS-REFERENCES TO RELATED APPLICATIONS

This patent application is a continuation-in-part application and is entitled to claims the benefit of pending U.S. application Ser. No. 14/353,005, entitled "IMBEDDED TOUCH SCREEN LIQUID CRYSTAL DISPLAY DEVICE AND TOUCH DRIVE METHOD THEREOF" filed Jun. 23, 2014, which claims the benefit of International Application No. PCT/CN2012/081426, filed Sep. 14, 2012 and Chinese Application No. 201110383654.3, filed Nov. 25, 2011, the contents of all of which are incorporated herein by reference in their entirety for all purposes.

TECHNICAL FIELD

The present invention relates to the field of display, in particular to An Active Matrix Organic Light Emitting Diode panel and a method of driving an AMOLED panel.

BACKGROUND

Due to its advantages such as light weight and thinness, a Liquid Crystal Display (LCD) device has gradually developed as one of the fastest growing flat panel displays. The LCD device displays images using liquid crystal material. The transmittance of the liquid crystals varies with the voltage applied to the liquid crystals, in order for displaying with different gray scales. Further, a color filter layer is placed in the direction of emitting lights for the purpose of displaying images or videos in color. Typically, the LCD device has an input portion including an operation interface, as well as a system portion for processing a signal inputted through the input portion, to display the images or videos by a control signal outputted from the system portion through unidirectional communication.

Recently, a touch panel is integrated with the LCD device to form a touch panel LCD device, so that a user's instruction can be directly inputted through the touch panel disposed on the LCD device, in order for more simple and convenient operations. With the touch panel disposed on the top of the LCD device, when the user touches a displayed icon with his/her finger or a light pen and selects a command to be executed, a touch point (i.e. a touched position) is detected by the touch panel and the LCD device is driven according to the command corresponding to the selected icon, to achieve the specific display. The touch panel can be used without other input means (such as a keyboard or a mouse) and without a keypad for a mobile product, therefore, the LCD device with the touch panel will be more and more widely applied in the display system.

Currently, the touch panel is simply assembled and used with the LCD device. In addition, interferences other than user touch signals need to be eliminated as much as possible during the operation of the touch panel, therefore, a transparent electrode shielding layer is typically disposed between a touch panel electrode layer for detecting the touched position and a common electrode layer of the LCD device, in order to reduce the affection of noise in the LCD device on the touch panel.

FIG. 1 is a schematic view of the structure of an existing touch panel LCD device. As shown in FIG. 1, the existing touch panel LCD device includes a LCD panel 10 and a touch panel 20 independent of and located above the LCD panel 10. The LCD panel 10 includes, from bottom to top, a lower polarizer 11, a lower glass substrate 12, a Thin Film Transistor (TFT) layer 13, a liquid crystal layer 14, a common electrode layer 15, a color filter layer 16, an upper glass substrate 17 and an upper polarizer 18. The touch panel 20 includes, from bottom to top, a transparent shielding layer 21, a glass substrate 22, a touch operating layer 23 and a protective layer 24, with the transparent shielding layer 21 being typically made of an Indium Tin Oxide (ITO) layer. In use, the image displayed by the LCD panel 10 is visible to the user through the touch panel 20, and the user is allowed to perform an information inputting operation by means of the touch panel 20, to implement a man-machine interaction process. However, such a way that the touch panel 20 and the LCD panel 10 are manufactured separately and then assembled together will inevitably increase the thickness of the touch panel LCD device, resulting in a complicated display system and a complex manufacturing process, as well as high costs. Furthermore, although the transparent shielding layer 21 can effectively shield the impact on the touch panel 20 by the electric noise of the LCD panel 10, the provision of the Indium Tin Oxide (ITO) layer not only increases the difficulty of the manufacturing process, but also increases the overall thickness of the whole device, thereby negatively affecting the trend of lightening and thinning of the device.

SUMMARY

One inventive aspect is an in-cell touch panel liquid crystal display device. The display device includes a first substrate, a second substrate disposed opposite the first substrate, and a liquid crystal layer disposed between the first substrate and the second substrate. The display device also includes a common electrode layer disposed on a side of the second substrate facing the first substrate, where the common electrode layer includes a plurality of first common electrodes and a plurality of second common electrodes both arranged in a matrix. In addition, the the first common electrodes and the second common electrodes are configured to detect a touched position on the in-cell touch panel liquid crystal display device.

Another inventive aspect is a method of driving an in-cell touch panel liquid crystal display device. The display device includes a first substrate, a second substrate disposed opposite the first substrate, and a liquid crystal layer disposed between the first substrate and the second substrate. The display device also includes a common electrode layer disposed on a side of the second substrate facing the first substrate, where the common electrode layer includes a plurality of first common electrodes and a plurality of second common electrodes both arranged in a matrix. In addition, the first common electrodes and the second common electrodes are configured to detect a touched position on the in-cell touch panel liquid crystal display device. Furthermore, a common electrode layer of the device is time division multiplexed. The method includes providing a display signal to the common electrode layer in a display mode, and providing a touch detecting signal to the common electrode layer in a touch mode.

Another inventive aspect is a method of driving an in-cell touch panel liquid crystal display device. The display device includes a first substrate, a second substrate disposed opposite the first substrate, and a liquid crystal layer disposed between the first substrate and the second substrate. The display device also includes a common electrode layer disposed on a side of the second substrate facing the first substrate, where the common electrode layer includes a plurality of first common electrodes and a plurality of second common electrodes both arranged in a matrix. In addition, the first common electrodes and the second common electrodes are configured to detect a touched position on the in-cell touch panel liquid crystal display device. The method includes simultaneously providing a display signal and a touch detecting signal to a common electrode layer of the in-cell touch panel liquid crystal display device, and detecting a touched position on the in-cell touch panel liquid crystal display device while displaying an image.

Another inventive aspect is an AMOLED panel. The AMOLED panel includes a substrate; a thin film transistor (TFT) layer on the substrate comprising a TFT and a capacitor, a planarization layer covering the TFT layer, an anode layer on the planarization layer; a pixel defining layer having an opening exposing the anode layer; a light-emitting layer contacting the anode layer in the opening of the pixel defining layer; and a cathode layer on the light-emitting layer. The TFT has a gate electrode, a source electrode and a drain electrode; the cathode layer is patterned into a plurality of electrodes, and two separated electrodes of the plurality of electrodes are electrically connected to a conductive line in a different layer.

Another inventive aspect is a method for driving the AMOLED panel. The method includes electrically connecting all of the rows and columns to ground; and disconnecting all the rows and columns from the ground and sending stimulating signals to the rows sequentially and receiving sensing signals from each column in a touch mode.

DETAILED DESCRIPTION

For the sake of better understanding on the above objects, features and advantages of the present invention, specific embodiments of the present invention will be described in detail below in conjunction with the accompanying drawings. In the following description, numerous specific details are set forth in order to fully understand the present invention. However, the present invention can be implemented in many ways other than those described herein, and similar deductions can be made by persons skilled in the art without departing from the contents of the present invention. Therefore, the present invention is not limited to the specific embodiments disclosed below.

As mentioned above in the section of technical background, a touch panel and a liquid crystal display device are typically manufactured separately and then assembled together in the prior art, which not only increases the thickness of the touch panel liquid crystal display device, but also complicates the device, furthermore, such manufacturing process leads to a more complex technique and higher costs. In view of this, in the present invention, the function of the touch panel is integrated between two substrates of the liquid crystal display device, and a plurality of first common electrodes and a plurality of second common electrodes both arranged in a matrix are employed to detect a touched position (i.e. a touch point) on the in-cell touch panel liquid crystal display device, thus eliminating the adhering of the touch panel onto the liquid crystal display device, so that the manufacturing process is simple, and the thickness of the whole liquid crystal display device is reduced.

Figure 1:
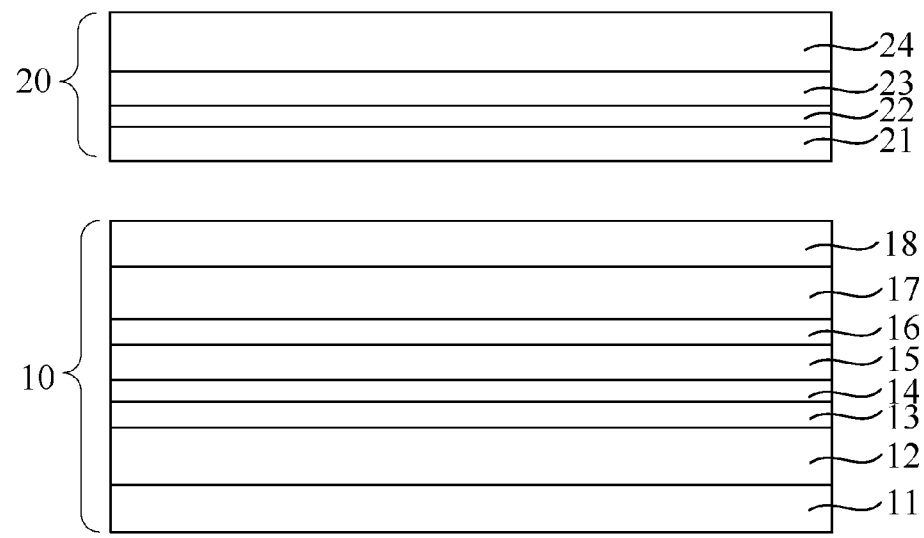
FIG. 1 is a schematic diagram of the structure of an existing touch panel liquid crystal display device.
Figure 2:
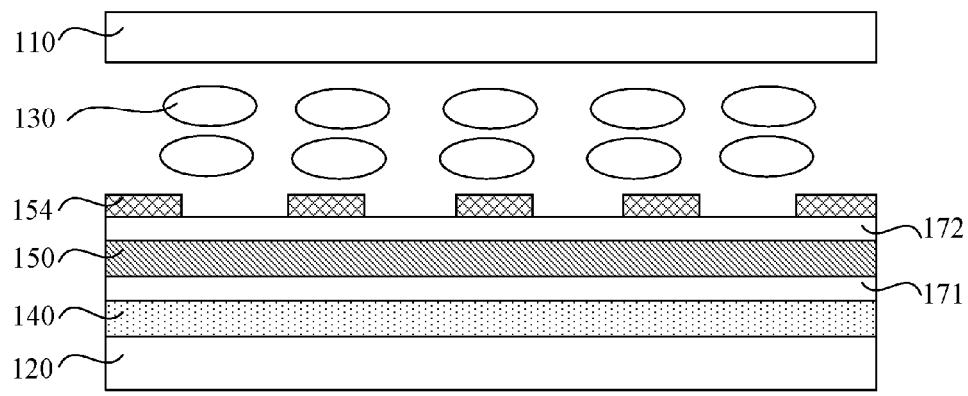
FIG. 2 is a schematic diagram of the structure of an in-cell touch panel liquid crystal display device according to a first embodiment of the present disclosure.
Figure 3:
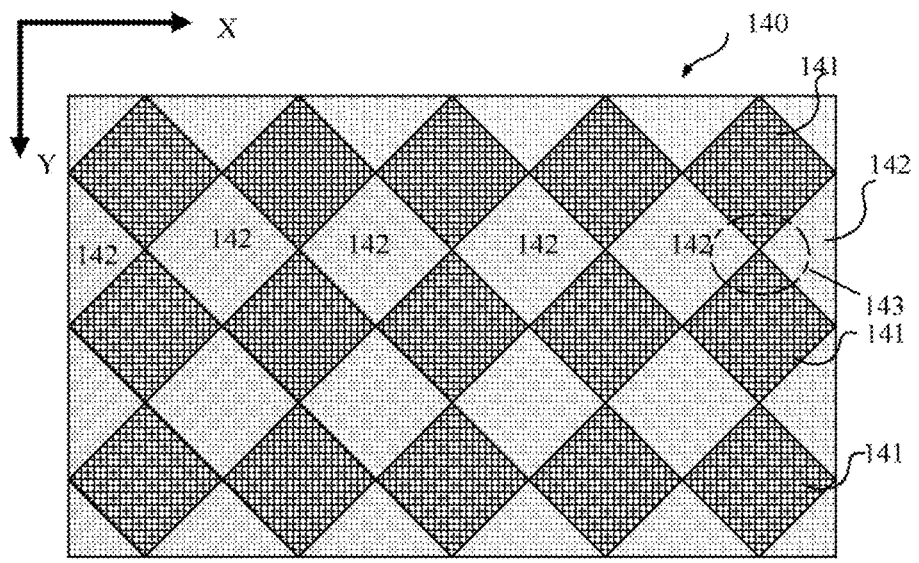
FIG. 3 is a schematic diagram of the distribution of a common electrode layer in FIG. 2.
Figure 4:
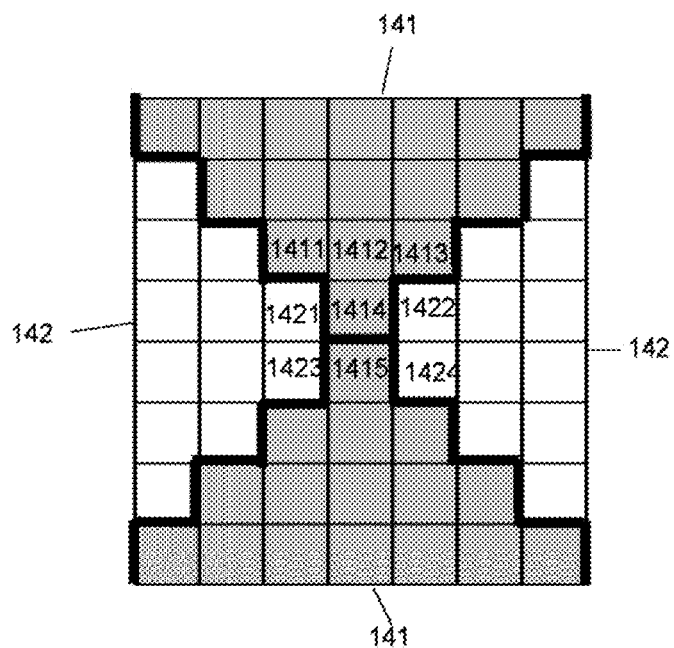
FIG. 4 is an enlarged view of a portion within a circle in FIG. 3.
Figure 5:
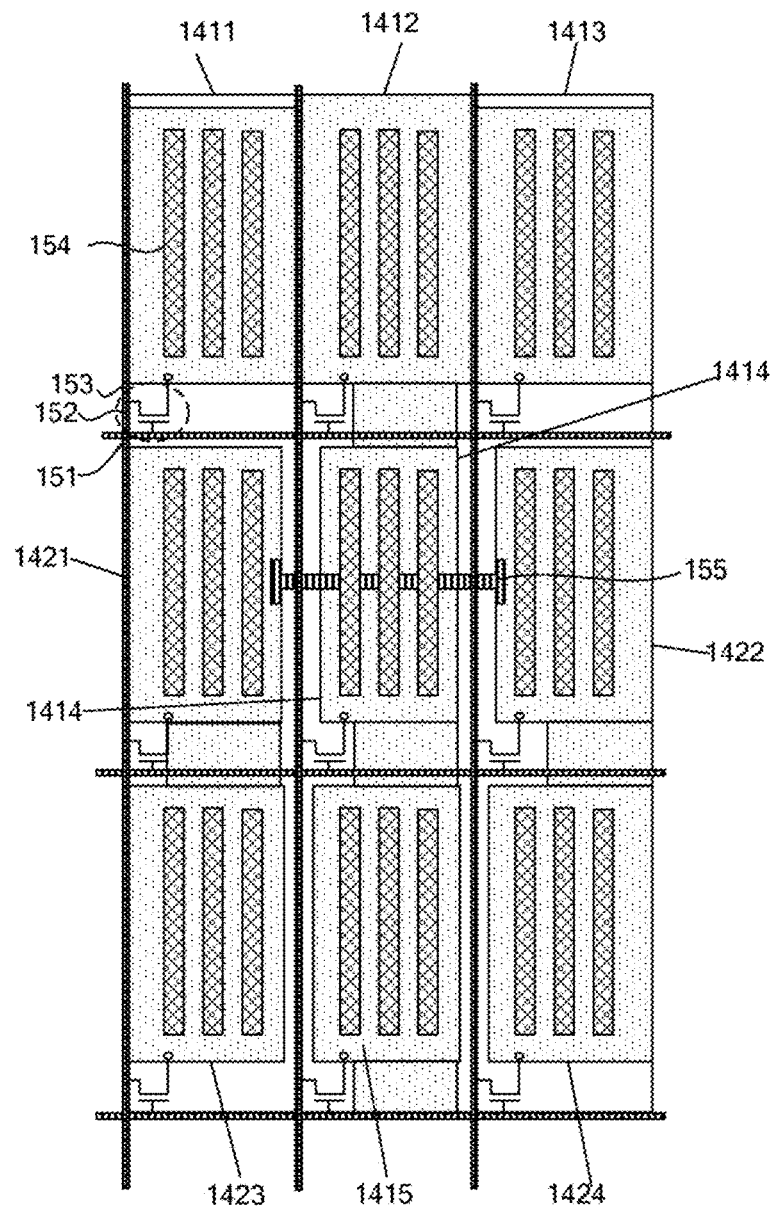
FIG. 5 is a schematic diagram of the structure of pixels shown in FIG. 4.
Figure 6:
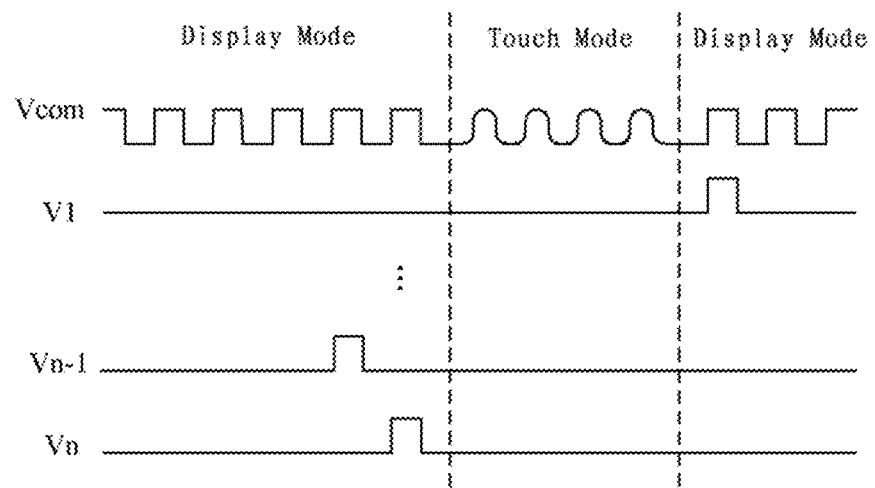
FIG. 6 is a timing diagram of a touch driving method of the in-cell touch panel liquid crystal display device according to the first embodiment of the present disclosure.

Reference is made to FIGS. 2 to 6, in which FIG. 2 is a schematic diagram of the structure of an in-cell touch panel liquid crystal display device according to a first embodiment; FIG. 3 is a schematic diagram of the distribution of a common electrode layer in FIG. 2; FIG. 4 is an enlarged view of a portion enclosed by a circle in FIG. 3; FIG. 5 is a schematic diagram of the structure of pixels shown in FIG. 4; and FIG. 6 is a timing diagram of a touch driving method of the in-cell touch panel liquid crystal display device according to the first embodiment.

As shown in FIGS. 2 to 5, an in-cell touch panel liquid crystal display device of the first embodiment includes:

a first substrate 110 and a second substrate 120 disposed opposite to each other;

a liquid crystal layer 130 disposed between the first substrate 110 and the second substrate 120; and a common electrode layer 140 disposed on a side of the second substrate 120 that faces the first substrate 110;

where the common electrode layer 140 includes a plurality of first common electrodes 141 and a plurality of second common electrodes 142 both arranged in a matrix, with the first common electrodes 141 and the second common electrodes 142 being configured for detecting a touched position on the in-cell touch panel liquid crystal display device.

In the first embodiment, the first substrate 110 is provided at the top and the second substrate 120 is provided at the bottom. A user can view the display of the liquid crystal display device from a side of the first substrate 110, and perform a touch operation on a side of the second substrate 120. The common electrode layer 140 is etched to form the plurality of first common electrodes 141 and the plurality of second common electrodes 142 both arranged in a matrix. In the first embodiment, each of the first common electrodes 141 and the second common electrodes 142 has a rhombic shape, but may have another shape as desired.

In the first embodiment of the present invention, the plurality of first common electrodes 141 are arranged in rows in a second direction (e.g., a direction Y) with adjacent two first common electrodes in each row being electrically connected, so as to function as drive lines, and the plurality of second common electrodes 142 are arranged in rows in a first direction (e.g., a direction X) with adjacent two first common electrodes in each row being electrically connected, so as to function as sense lines, in order to detect the touched position (i.e. the touch point) on the in-cell touch panel liquid crystal display device. The touch layer is integrated within the liquid crystal display device, thus eliminating the adhering of the touch panel onto the liquid crystal display device, so that the manufacturing process is simple, and the thickness of the device is reduced.

It can be understood that the above arrangement of the first common electrodes 141 and the second common electrodes 142 is preferable in the present invention, but not intended to limit the present invention, and the specific amount of pixel units, the common electrodes of which form one touch region, may depend on actual touch requirements, for example, depend on the general user's finger size. That is, any manner of dividing the common electrode layer into two intersecting parts for detecting the touch point is within the scope of the present invention.

Specifically, adjacent two first common electrodes 141 in each row are directly electrically connected together with each other in the direction Y, while the plurality of second common electrodes 142 are not directly connected to each other. FIGS. 4 and 5 schematically show nine pixel units 1411, 1412, 1413, 1414, 1415, 1421, 1422, 1423, and 1424, it may be understood that each of the first common electrodes and the second common electrodes is formed by common electrodes of a plurality of pixel units, for example, the pixel units 1411, 1412, 1413, and 1414 belong to one first common electrode 141, while the pixel unit 1415 belongs to another first common electrode 141 connected with said one first common electrode 141; likewise, the pixel units 1421 and 1423 belong to one second common electrode 142, while the pixel units 1422 and 1424 belong to another second common electrode 142 connected with said one second common electrode 142.

Next, the structure within the circle 143 in FIG. 3 will be described in more detail. As shown in FIGS. 4 and 5, two adjacent first common electrodes 141 are directly connected through the common electrodes of the adjacent pixel units 1414, 1415; while two adjacent second common electrodes 142 are electrically connected by a metal bridge 155 connecting the common electrodes of the adjacent pixel units respectively from these two adjacent second common electrodes 142. The plurality of second common electrodes 142 may be electrically connected in the direction X by the metal bridges. The metal bridge 155 may be implemented in various ways, such as by etching a separate layer of metal to form the metal bridge. However, in the first embodiment, the existing metal layer is utilized to form the metal bridge 155 to simplify the manufacturing process.

In the first embodiment of the present invention, the in-cell touch panel liquid crystal display device may be a liquid crystal display device of an In-Plane Switching (IPS) or Fringe Field Switching (FFS) mode, where the IPS/FFS mode is a liquid driving mode capable of broadening the visual angle, and the pixel electrodes in an array substrate in the IPS/FFS mode are strip-shaped to form a horizontal electric field.

In the first embodiment, the in-cell touch panel liquid crystal display device is an IPS-type liquid crystal display device, and further includes a TFT layer 150 disposed on the second substrate 120, and the TFT layer 150 includes scan lines 151 and data lines 152 intersecting with the scan lines 151, with TFTs 153 being formed in pixel regions defined by the scan lines 151 and the data lines 152. The TFT 153 includes: a gate electrode electrically connected to the scan line 151, as well as a gate insulating layer, a semiconductor layer, a source electrode and a drain electrode which are disposed on the gate electrode. A pixel electrode 154 disposed on the second substrate 120 is electrically connected with the drain electrode of the TFT 153 through a through hole (not shown), and the source electrode of the TFT 153 is electrically connected with the data line 152. The scan line 151 and the gate electrode, which are typically formed in the same process step, are in the same layer and can be formed integrally; in addition, the metal forming the source electrode of the TFT and the metal forming the drain electrode, which are typically formed in the same process step, are in the same layer and collectively referred to as a source/drain electrode metal layer. In general, the source/drain electrode metal layer and the gate electrode metal layer are inevitably formed in the process of manufacturing the TFT layer 150, thus in the first embodiment, the connection of two second common electrodes in the direction X is implemented by the metal bridge which is made by the metal located in the same layer with the scan line 151, because the scan line 151 is also provided in the direction X. The in-cell touch panel liquid crystal display device further includes a first insulating layer 171 disposed between the common electrode layer 140 and the TFT layer 150, and a second insulating layer 172 disposed between the common electrode layer 140 and the pixel electrode 154.

In the first embodiment, preferably, the outer side of the first substrate 110 is further provided with a shielding layer. To reduce the impact on the in-cell touch panel liquid crystal display device by any external noise, the shielding layer is typically disposed at the outer side of the in-cell touch panel liquid crystal display device. In the first embodiment, the common electrode layer 140 is arranged on a side of the second substrate 120 and is configured to shield the noise from the external of the second substrate 120, meanwhile, it is also required to arrange a shielding layer at the outer side of the first substrate 110 to shield the noise from the external of the first substrate 110.

Further, the in-cell touch panel liquid crystal display device further includes a display signal generating unit and a touch detecting signal generating unit (not shown), where the display signal generating unit is configured for providing a display signal to the common electrode layer 140 (including the first common electrodes 141 and the second common electrodes 142), and the touch detecting signal generating unit is configured for providing a touch detecting signal to the common electrode layers 140. The touch detecting signal includes an excitation signal and a detection signal. In the first embodiment, the touch detecting signal generating unit is configured for providing the excitation signal to the first common electrodes 141 serving as driving electrodes, and providing the detection signal to the second common electrodes 142 serving as sensing electrodes. Alternatively, in other specific embodiments of the present invention, it is possible that the touch detecting signal generating unit provides the excitation signal to the second common electrode, and provides the detection signal to the first common electrode.

The first embodiment also provides a touch driving method for the in-cell touch panel liquid crystal display device described as above, and the common electrode layer 140 is used in a time division multiplexing manner in the method. The in-cell touch panel liquid crystal display device has two operating modes, i.e. a display mode and a touch mode. In the display mode, the display signal is provided to the common electrode layer 140, so that the in-cell touch panel liquid crystal display device operates for displaying; while in the touch mode, the touch detecting signal is provided to the common electrode layer 140, so that the in-cell touch panel liquid crystal display device operates for touch detecting.

As shown in FIG. 6, at the beginning of each frame, the in-cell touch panel liquid crystal display device firstly operates in the display mode, where the display signal includes a pixel selecting signal and a data signal, the display signal generating unit provides a common voltage Vcom to the first common electrodes 141 and the second common electrodes 142 and provides the pixel selecting signal in order to apply scanning voltages V1 . . . , Vn−1, Vn, which are higher than the turning-on threshold voltage of the TFTs, to the scan lines 151 line by line, so that the TFTs are turned on line by line due to the scanning voltages; further, the display signal generating unit provides a data signal to the data lines 152, to send the data signal to each of the TFTs through the data lines 152. As a result, an electric field in parallel with the first substrate 110 and the second substrate 120 is formed between the strip-shaped pixel electrodes 154 and the common electrode layer 140 and causes liquid crystal molecules to deflect along the direction of the electric field, so that the liquid crystal display array operates to display an image, and each of pixel units operates for displaying properly.

When the in-cell touch panel liquid crystal display device subsequently operates in the touch mode, a touch can be detected by controlling the first common electrodes 141 and the second electrodes 142. For example, in a mutual capacitance mode, the first common electrodes 141 serve as driving electrodes and the second common electrodes 142 serve as sensing electrodes, the excitation signal is provided to the first common electrodes 141 and the detection signal is provided to the second common electrodes 142, so that a mutual capacitance is present at an overlapping position between the first common electrode 141 and the second common electrode 142. If the in-cell touch panel liquid crystal display device is touched by a finger, partial current will flow to the finger, which is equivalent to that the mutual capacitance changes, so that the detection signal on the second common electrode 142 serving as the sensing electrode changes, thereby detecting whether the finger touches the in-cell touch panel liquid crystal display device. Alternatively, it is possible that the second common electrodes 142 serve as driving electrodes and the first common electrodes 141 server as sensing electrodes, and the excitation signal is provided to the second common electrodes 142 and the detection signal is provided to the first common electrodes 141, to likewise achieve the object of the present invention.

When the frame is ended and the next frame is started, the in-cell touch panel liquid crystal display device operates in the display mode once again, and the above-mentioned alternating process is repeated. Of course, the foregoing description is merely a specific embodiment of the present invention, depending on the specific timing distribution within the time period in each frame in the touch driving method of the present invention, and thus the present invention is not limited to the above-mentioned manner in which the display mode is followed by the touch mode. Alternatively, it is possible that the touch mode is followed by the display mode in each frame. Other control solutions employed in the above touch driving method may also be deduced reasonably by those skilled in the art according to the specific timing.

It can be known from the above description that, in the touch driving method in which the common electrode layer 140 is used in the time division multiplexing manner, the displaying time period and the touch detecting time period of the in-cell touch panel liquid crystal display device are separated from each other, so that the image displaying and the touch sensing do not impact on each other, thereby improving the accuracy of the touch sensing and the imaging quality of the in-cell touch panel liquid crystal display device.

Alternatively, the in-cell touch panel liquid crystal display device may be provided with another touch driving method, in which the display signal and the touch detecting signal are simultaneously provided to the common electrode layer 140 to detect the touched position on the in-cell touch panel liquid crystal display device while in the displaying of the pixels. That is, the display signal generating unit provides the display signal to the common electrode layer 140, and simultaneously, the touch detecting signal generating unit provides the touch detecting signal (including the excitation signal and the detection signal) to the common electrode layer 140, so that the in-cell touch panel liquid crystal display device simultaneously operates for touching and displaying. Typically, the touch detecting signal is a high frequency signal (having a relatively short cycle), and the display signal is a low frequency signal (having a relatively long cycle). As long as the equivalent DC component of the excitation signal is consistent with the common voltage Vcom, the pixel units are unresponsive due to the limited time, thus, it can be ensured that the touch detecting function is realized without compromising the image displaying of the liquid crystal display array, and the imaging quality can be guaranteed.

As such, in the in-cell touch panel liquid crystal display device provided by the first embodiment of the present invention, the function of a touch panel is integrated between those two substrates of the liquid crystal display device, and the first common electrodes and the second common electrodes intersecting with each other are employed to detect the touched position on the in-cell touch panel liquid crystal display device, thereby eliminating the adhering of the touch panel onto the liquid crystal panel of the liquid crystal display device, so that the manufacturing process is simple, and the thickness of the liquid crystal display device is reduced.

A second embodiment is different from the first embodiment in that, adjacent two first common electrodes in each row are connected in a first direction (i.e. a direction X) by directly connected common electrodes of adjacent pixel units, and adjacent two second common electrodes in each row are connected in a second direction (i.e. a direction Y) by metal bridges each connecting common electrodes of two vertically adjacent pixel units.

Figure 7:
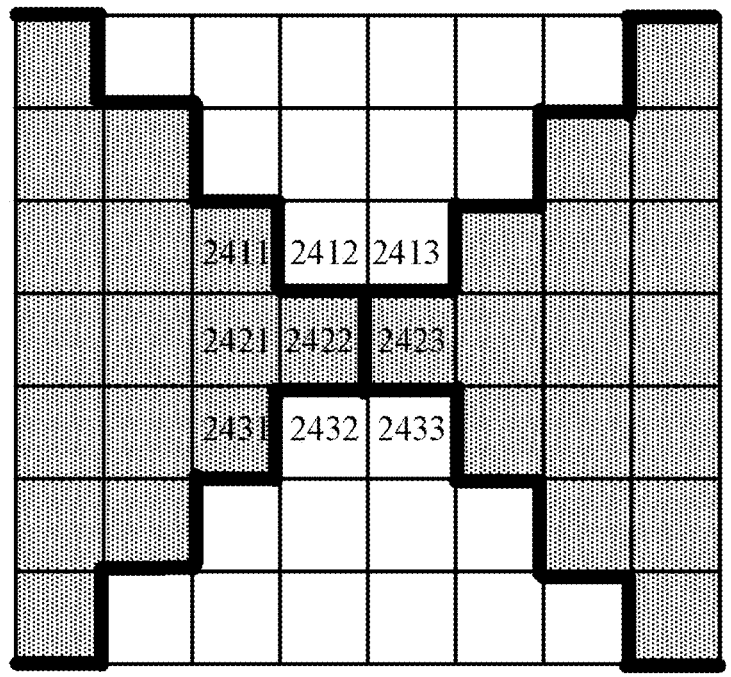
FIG. 7 is a schematic diagram showing the arrangement of the common electrodes of the in-cell touch panel liquid crystal display device according to a second embodiment of the present disclosure.
Figure 8:
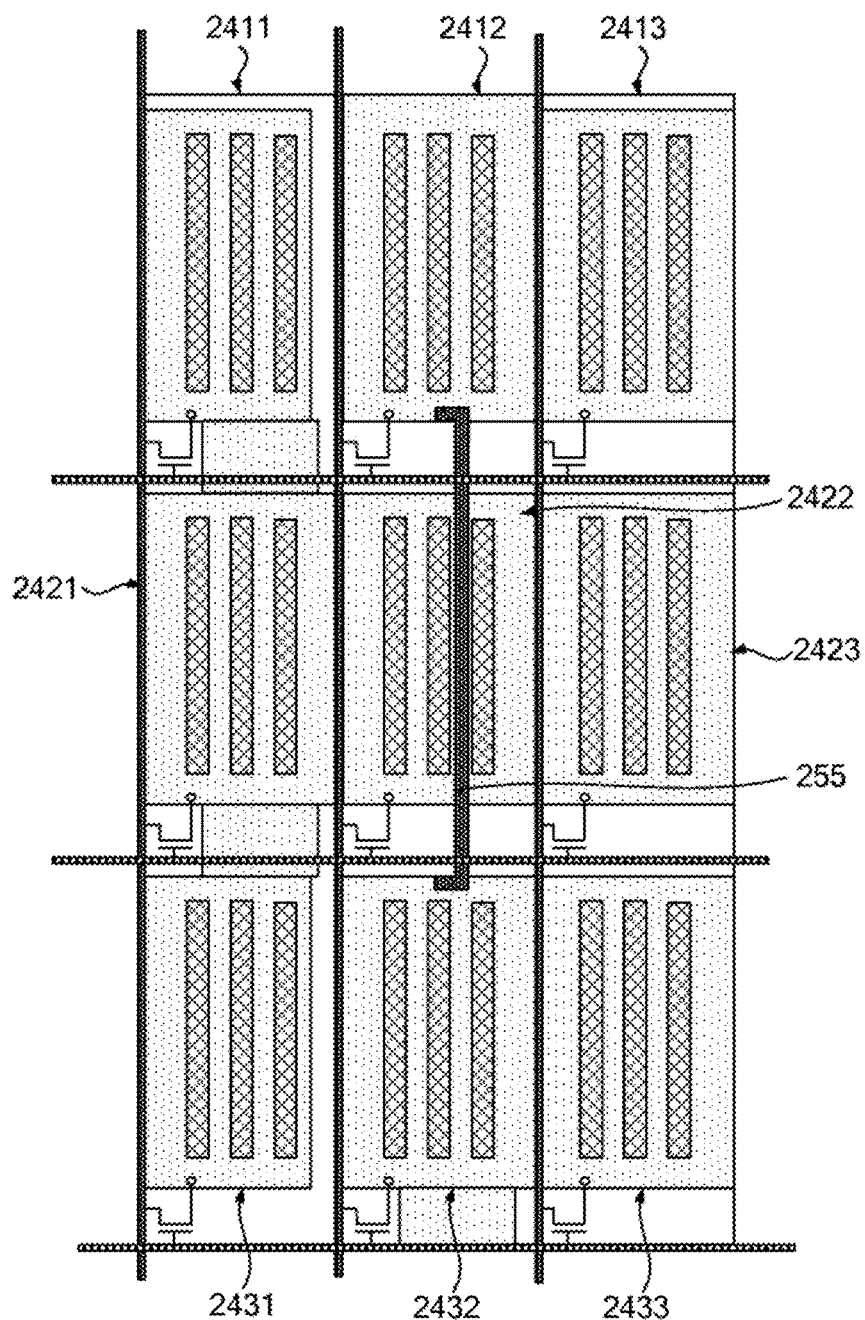
FIG. 8 is a schematic diagram showing the structure of pixels of the in-cell touch panel liquid crystal display device according to the second embodiment of the present disclosure.

Specifically, the common electrode layer is also etched to form a plurality of first common electrodes and a plurality of second common electrodes both arranged in a matrix. FIGS. 7 and 8 merely show nine pixel units 2411, 2412, 2413, 2421, 2422, 2423, 2431, 2432, and 2433, where the pixel units 2411, 2421, 2422, and 2431 are included in one first common electrode, and the pixel unit 2423 is included in another first common electrode; likewise, the pixel units 2412 and 2413 are included in one second common electrode, and the pixel unit 2432 and 2433 are included in anther second common electrode.

The adjacent two first common electrodes in each row are connected in the direction X by directly connected common electrodes of adjacent pixel units, and the adjacent two second common electrodes in each row are connected in the direction Y by the metal bridges 255 each connecting the common electrodes of two vertically adjacent pixel units. Similarly, the metal bridge 255 may be implemented in various ways, such as by etching a separate layer of metal to form the metal bridge. However, in the second embodiment, the existing metal layer is utilized. Specifically, to provide the metal bridges in the direction Y, a metal layer (e.g., a gate electrode metal layer) in the same layer with the data lines is used, because the data lines are also provided in the direction Y.

The operating manner of the in-cell touch panel liquid crystal display device in the second embodiment is the same as that in the first embodiment, and therefore is not described in detail here, but should be understood by those skilled in the art.

In the first embodiment of the present invention, two adjacent first common electrodes are directly connected in the second direction (e.g. a direction Y) through the common electrodes of adjacent pixel units respectively from these two adjacent first common electrodes; while two adjacent second common electrodes are electrically connected by the metal bridge connecting the common electrodes of the horizontally adjacent pixel units respectively from these two adjacent second common electrodes. In the second embodiment of the present invention, two adjacent first common electrodes are directly connected in the first direction (e.g. a direction X) through the common electrodes of two adjacent pixel units respectively from these two adjacent first common electrodes; while two adjacent second common electrodes are electrically connected by the metal bridge connecting the common electrodes of the vertically adjacent pixel units respectively from these two adjacent second common electrodes. However, it should be noted that in other embodiments of the present invention, adjacent first common electrodes may be connected by the metal bridge connecting the common electrodes of the adjacent pixel units respectively from these adjacent first common electrodes, while adjacent second common electrodes may also be connected by the metal bridge connecting the common electrodes of the adjacent pixel units respectively from these adjacent second common electrodes. For example, the first common electrodes are disposed in the same direction with the scan lines, the second common electrodes are disposed in the same direction with the data lines, the first common electrodes are electrically connected by the metal bridge located in the same layer with the scan lines, and the second common electrodes are electrically connected by the metal bridge located in the same layer with the data lines.

In the first and second embodiments of the present invention, a user can view the display of the liquid crystal display device from a side of the first substrate, and perform a touch operation on a side of the second substrate. However, in a third embodiment, the liquid crystal display device can be viewed and touched simultaneously from a side of the second substrate, that is, the common electrode layer, the TFT layer and the pixel electrodes are sequentially disposed at the inner side of the second substrate, and the common electrode layer may also have an effect of shielding the interference from the external signal. The shielding effect of the common electrode layer is like that of the transparent shielding layer employed in the traditional touch panel liquid crystal display device, to reduce the interference caused by the external electric field to the display of the liquid crystal display device, so that an additional specialized transparent shielding layer is unnecessary, thus reducing the difficulty of the manufacturing process and the manufacturing costs.

Figure 9:
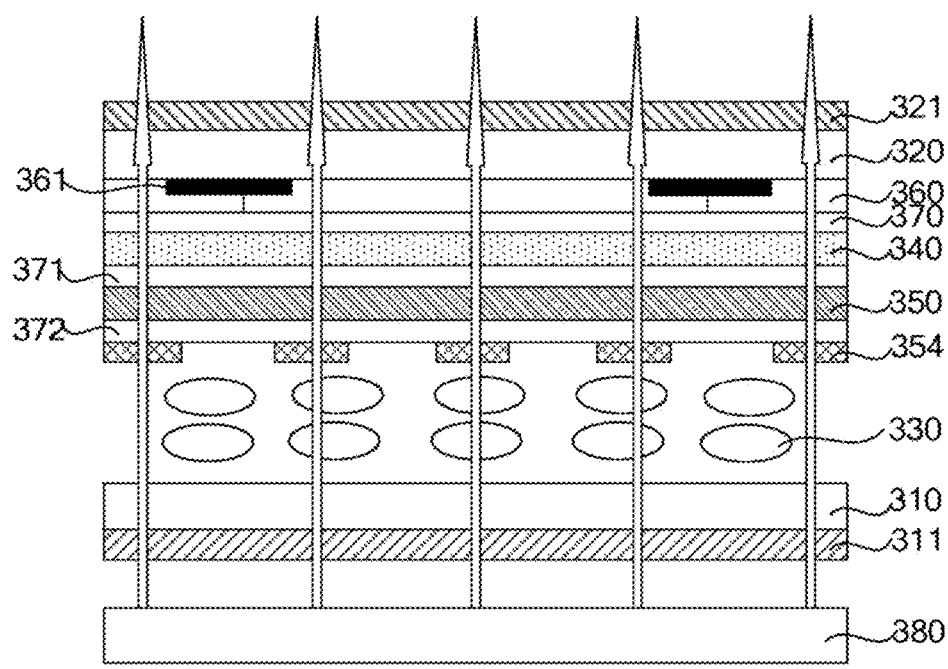
FIG. 9 is a schematic diagram of the structure of the in-cell touch panel liquid crystal display device according to a third embodiment of the present disclosure.

Specifically as shown in FIG. 9, the in-cell touch panel liquid crystal display device of the third embodiment includes:

a first substrate 310 and a second substrate 320 disposed opposite to each other;

a liquid crystal layer 330 disposed between the first substrate 310 and the second substrate 320; and a common electrode layer 340 disposed on a side of the second substrate 320 that faces the first substrate 310;

where the common electrode layer 340 includes a plurality of first common electrodes and a plurality of second common electrodes both arranged in a matrix, with the first common electrodes and the second common electrodes being configured for detecting a touched position on the in-cell touch panel liquid crystal display device.

Furthermore, the in-cell touch panel liquid crystal display device further includes a TFT layer 350 which is disposed on a side of the second substrate 320 that faces the first substrate 310, the TFT layer 350 includes scan lines and data lines intersecting with the scan lines, and TFTs are formed in pixel regions defined by the scan lines and the data lines. The TFT includes: a gate electrode electrically connected to the scan line, as well as a gate insulating layer, a semiconductor layer and a source/drain electrode metal layer which are sequentially disposed on the gate electrode, with the source electrode of the TFT being electrically connected with the data line.

Optionally, the TFT layer further includes an ohmic contact layer formed between the semiconductor layer and the source/drain electrode metal layer. The ohmic contact layer is made of N+ doped amorphous silicon for example, to form an ohmic contact. For the sake of concision, the gate insulating layer, the semiconductor layer and the ohmic contact layer are not indicated in the figures, but should be understood by those skilled in the art.

The in-cell touch panel liquid crystal display device of the third embodiment is a liquid crystal display device of an IPS mode or an FFS mode. Specifically, the in-cell touch panel liquid crystal display device further includes a color filter layer 360, a passivation layer 370, an upper polarizer 321, a lower polarizer 311 and a backlight 380. The color filter layer 360, which is disposed between the second substrate 320 and the common electrode layer 340, is configured for displaying in color; the passivation layer 370 is disposed between the color filter layer 360 and the common electrode layer 340; the upper polarizer 321 is disposed on a side of the second substrate 320 away from the first substrate 310; the lower polarizer 311 is disposed on a side of the first substrate 310 away from the second substrate 320; and the backlight 380 is disposed at a side of the lower polarizer 311. In the third embodiment, the color filter layer 360, the common electrode layer 340, and the TFT layer 350 are sequentially disposed on the same substrate, and the common electrode layer 340 has an effect of shielding the interference from the external signal, that is, the shielding effect of the common electrode layer 340 is like that of the transparent shield layer employed in the traditional touch panel liquid crystal display device, to reduce the noise interference, so that an additional specialized transparent shield layer is unnecessary, thus reducing the difficulty of the manufacturing process and the manufacturing costs.

As shown in FIG. 9, the in-cell touch panel liquid crystal display device further includes a first insulating layer 371 and a second insulating layer 372, where the first insulating layer 371 is disposed between the common electrode layer 340 and the TFT layer 350, and the second insulating layer 372 is disposed between the TFT layer 350 and the pixel electrodes 354, in order for an isolation effect. Further, to facilitate the production, the color filter layer 360 is formed across the entire second substrate 320, but a black matrix layer 361 is disposed on the portion of the second substrate 320 to be shielded. Alternatively, in other specific embodiments of the present invention, the color filter layer 360 and the black matrix layer 361 may be disposed alternately, rather than forming the color filter layer 360 across the entire second substrate 320.

In other embodiments, the color filter layer may also be formed on the outer side of the second substrate 320, which should falls into the scope of the present invention.

The distribution manner of the first common electrodes and the second common electrodes in the third embodiment is similar with that in the common electrode layer structure in the first embodiment or the second embodiment, and the touch driving method in the third embodiment is also similar with that in the first embodiment or the second embodiment, and will not be discussed in detail here.

Because the in-cell touch panel liquid crystal display device provided in the third embodiment may be viewed and touched simultaneously at a side of the second substrate 320, it is more convenient in use, and the backlight can be installed on a side of the first substrate 310, to provide a more uniform and stable light source, thereby enabling a better display effect.

In the third embodiment, because the backlight is installed on the side of the first substrate 310, a metal frame for the backlight can shield the signal noise from the outer side of the first substrate 310; meanwhile, because the in-cell touch panel liquid crystal display device can be viewed and touched by a user from a side of the second substrate 320, the common electrode layer 340 disposed above the pixel electrodes 354 and the TFT layer 350 and below a side of the second substrate 320 has an effect of shielding the signal noise from the outer side of the second substrate 320, to reduce the noise inference. Therefore, in the in-cell touch panel liquid crystal display device provided by the third embodiment, an additional specialized transparent shielding layer is unnecessary, thus reducing the difficulty of the manufacturing process and the manufacturing costs.

Figure 10:
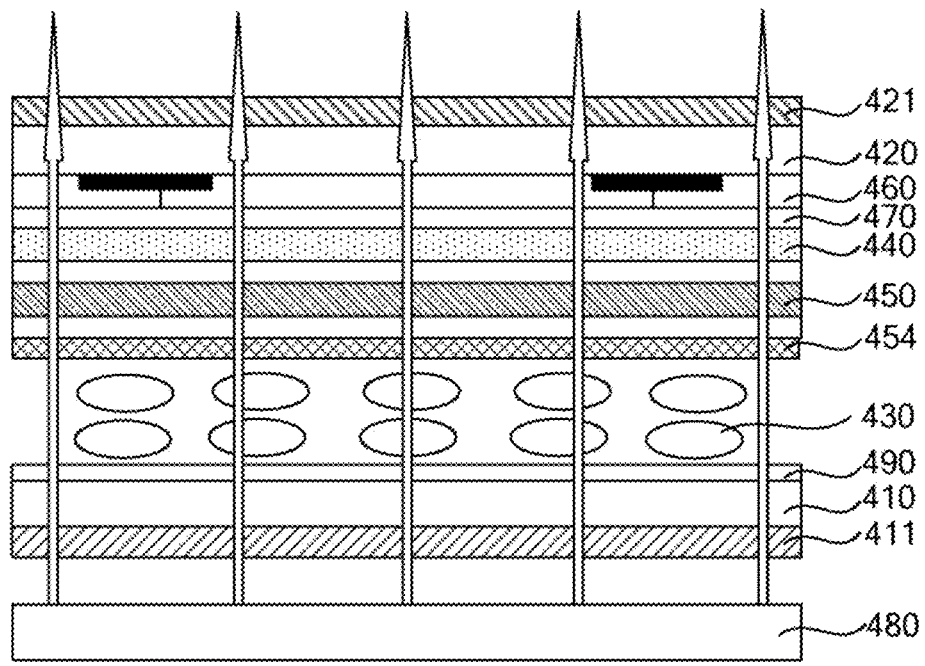
FIG. 10 is a schematic diagram of the structure of the in-cell touch panel liquid crystal display device according to a fourth embodiment of the present disclosure.

The present invention will be described in a fourth embodiment by taking an in-cell touch panel liquid crystal display device of a TN/AV mode, for example. As shown in FIG. 10, the in-cell touch panel liquid crystal display device includes:

a first substrate 410 and a second substrate 420 disposed opposite to each other;

a liquid crystal layer 430 disposed between the first substrate 410 and the second substrate 420; and a common electrode layer 440 disposed on a side of the second substrate 420 that faces the first substrate 410, where the common electrode layer 440 includes a plurality of first common electrodes and a plurality of second common electrodes both arranged in a matrix, with the first common electrodes and the second common electrodes being configured for detecting a touched position on the in-cell touch panel liquid crystal display device;

a TFT layer 450 disposed on the inner side of the second substrate 420;

a color filter layer 460 disposed between the second substrate 420 and the common electrode layer 440;

a passivation layer 470 disposed between the color filter layer 460 and the common electrode layer 440;

a lower polarizer 411 disposed on a side of the first substrate 410 away from the second substrate 420;

an upper polarizer 421 disposed on a side of the second substrate 420 away from the first substrate 410;

a backlight 480 disposed at a side of the lower polarizer 411; and a second common electrode layer 490 disposed on a side of the first substrate 410 that faces the second substrate 420.

Compared with the third embodiment, a vertical electric field is formed in the in-cell touch panel liquid crystal display device of the fourth embodiment, thus the second common electrode layer 490 need be formed on the first substrate 410. The distribution manner of the first common electrodes and the second common electrodes is the same with that in the common electrode layer structure in the first embodiment or second embodiment, in addition, the touch driving method of the in-cell touch panel liquid crystal display device is also similar with that in the first embodiment and the second embodiment.

As such, the in-cell touch panel liquid crystal display device of the present invention is not only applicable to the IPS/FFS mode, but also to the TN/AV mode or other modes. In the present invention, the function of the touch panel is integrated between two substrates of the liquid crystal display device, the plurality of first common electrodes arranged and connected together in the first direction serve as drive lines, and the plurality of second common electrodes arranged and connected together in the second direction serve as sense lines, to detect the touched position on the in-cell touch panel liquid crystal display device, thereby eliminating the adhering of the touch panel to the liquid crystal panel of the liquid crystal display device, so that the manufacturing process is simple, the thickness of the liquid crystal display device is reduced, and the manufacturing costs are reduced.

It is noted that the above-mentioned in-cell touch panel liquid crystal display device is introduced merely as the preferred embodiment, and the amount of the layers in the in-cell touch panel liquid crystal display device can be increased or reduced by those skilled in the art according to actual production requirements, and types, materials and thicknesses of each layer can also be selected as needed, and will not be discussed in detail here.

Active matrix organic light-emitting diode (AMOLED) is an alternative display technology. AMOLED displays are self-emissive devices, and do not require backlights. Compared with liquid crystal display (LCD), the AMOLED display offers a larger viewing angle, faster response time, higher contrast, lighter weight, lower power consumption, and lower cost. Further, AMOLED display can provide more vivid colors and a larger color gamut than conventional LCD. AMOLED display may be used in electronic devices such as televisions, computer displays, cell phone panels, tablets, and the like.

Figure 11:
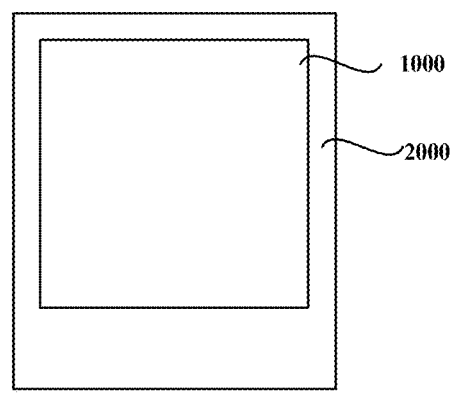
FIG. 11 is a plan view of an electronic device including an AMOLED panel according to an embodiment of the present disclosure.

FIG. 11 shows a conceptual electronic device including an active area 1000 (namely, display area) and a peripheral area 2000 (namely, non-display area).

Figure 12:
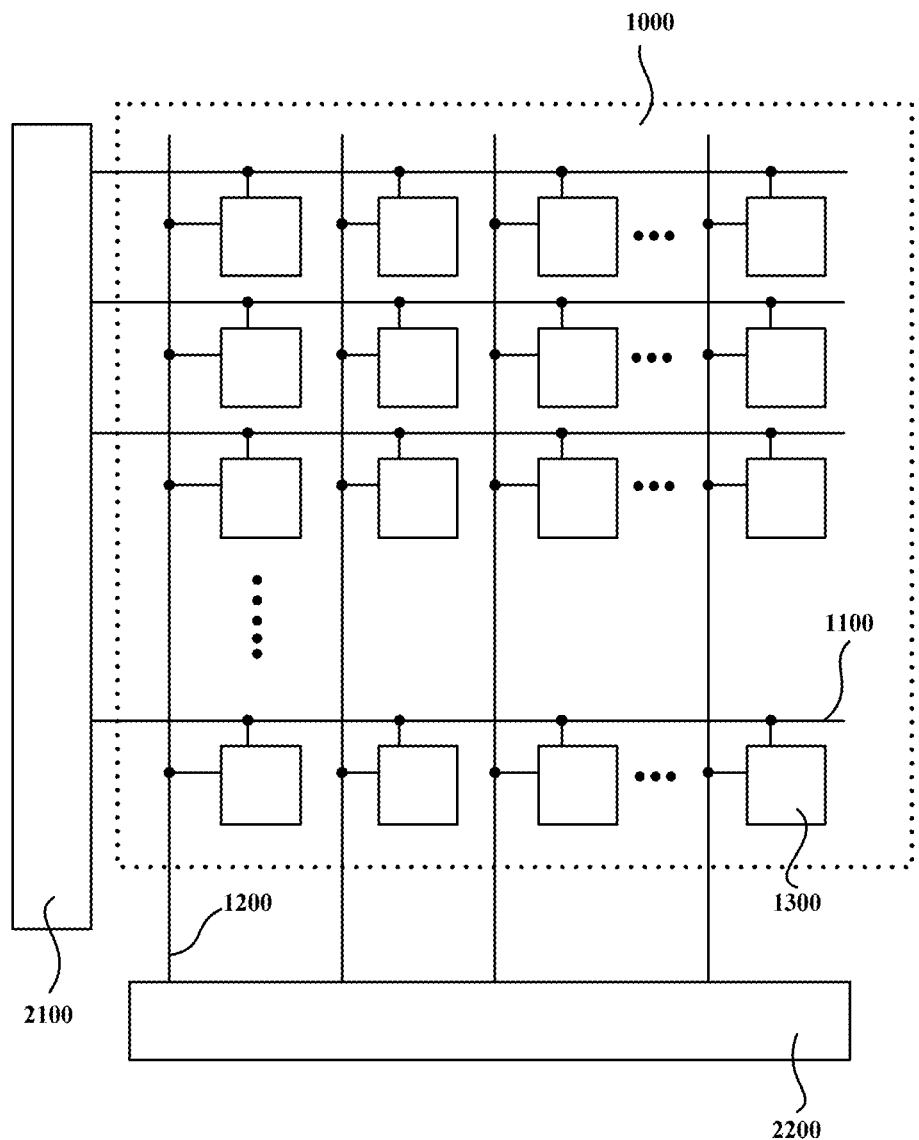
FIG. 12 is a block diagram showing an AMOLED panel according to an embodiment of the present disclosure.

FIG. 12 illustrates an AMOLED panel according to an embodiment of the present disclosure. The AMOLED panel in FIG. 12 includes: a select line driver 2100, a data line driver 2200, a plurality of select lines 1100, a plurality of data lines 1200 and a pixel matrix. The pixel matrix includes a plurality of pixel units 1300. The select line driver 2100 and the data line driver 2200 may be arranged in the peripheral area 2000 and the pixel matrix may be arranged in the active area 1000. The plurality of select lines 1100 extend, in a first direction, from the select line driver 2100 into the active area 1000. The plurality of data lines 1200 extend, in a second direction, from the data line driver 2200 into the active area 1000.

Each of the plurality of pixel units 1300 includes an organic light-emitting diode (OLED). Each of the plurality of pixel units 1300 is connected to a corresponding one of the plurality of select lines 1100 and a corresponding one of the plurality of data lines 1200. When a pixel unit is selected by the select line driver 2100, the pixel unit receives and stores a data signal associated with a pixel luminance via the corresponding data line 1200 from the data line driver 2200. Since the OLED is a current driven device, each pixel unit further includes a circuit to store the data signal and to drive the OLED.

Figure 13:
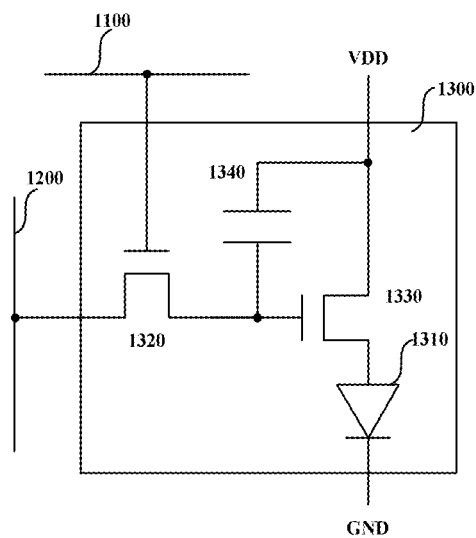
FIG. 13 is a circuit diagram corresponding to one pixel unit of an AMOLED panel according to an embodiment of the present disclosure.

As illustrated in FIG. 13, according to an embodiment of the present disclosure the pixel unit 1300 includes a first thin film transistor (TFT) 1320, a second TFT 1330, a capacitor 1340 and an OLED 1310. Each of the first TFT 1320 and the second TFT 1330 has a gate electrode, a drain electrode and a source electrode. The first TFT 1320 is used for switching and the second TFT 1330 is used for providing a driving current for the OLED 1310. The capacitor 1340 is used for storing the data signal associated with the pixel luminance.

Figure 14:
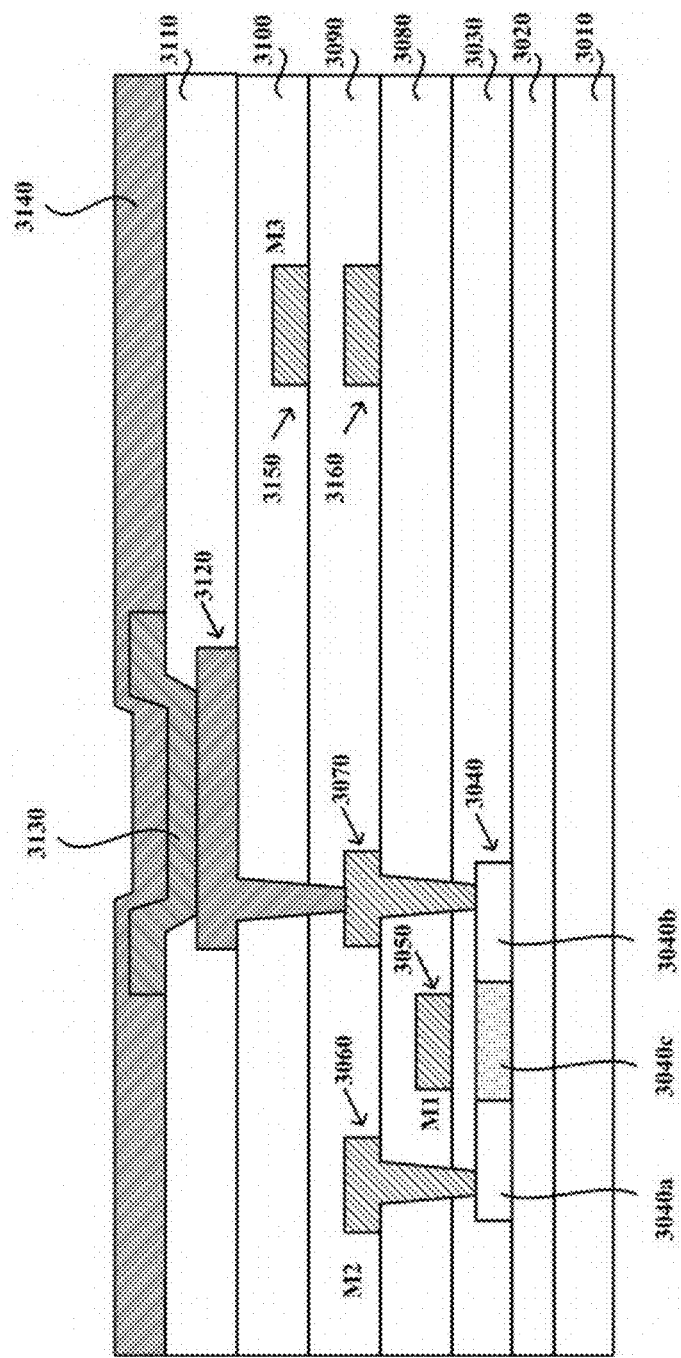
FIG. 14 is a schematic diagram showing a cross-sectional view of a portion of a pixel unit of an AMOLED panel according to an embodiment of the present disclosure.

The gate electrode of the first TFT 1320 is electrically connected to the corresponding select line 1100, the source electrode of the first TFT 1320 is electrically connected to the corresponding data line 1200, and the drain electrode of the first TFT 1320 is electrically connected to the gate electrode of the second TFT 1330. The source electrode of the second TFT 1330 is electrically connected to a supply voltage line (VDD). The capacitor 1340 is disposed between the source electrode and the gate electrode of the second TFT 1330. An anode of the OLED 1310 is electrically connected to the drain electrode of the second TFT 1330 and a cathode of the OLED 1310 is electrically connected to ground (GND). Alternatively, the OLED 1310 may be disposed between the source electrode of the second TFT 1330 and the supply voltage line, and the capacitor 1340 is disposed between the drain electrode and the gate electrode of the second TFT 1330. In the present embodiment the circuit for storing the data signal and driving the OLED 1310 is composed of the first TFT 1320, the second TFT 1330 and the capacitor 1340. Note that the circuit for storing the data signal and driving the OLED has alternatively implementations. FIG. 14 is a schematic diagram showing a cross-sectional view of a portion of a pixel unit of an AMOLED panel according to an embodiment of the present disclosure. As shown, the AMOLED panel includes a substrate 3010, a TFT layer, an anode layer 3120, an emissive layer (EML) 3130 and a cathode layer 3140. The anode layer 3120, the emissive layer 3130 and the cathode layer 3140 collectively make up the OLED 1310 in FIG. 13. A buffer layer 3020 may be provided between the TFT layer and the substrate 3010. The first TFT 1320, the second TFT 1330, the capacitor 1340, the select lines 1100 and the data lines 12000 in FIG. 13 are collectively shown as TFT layers from 3030 to 3050 as. An active layer 3040 is provided on the buffer layer 3020. The active layer 3040 is used for forming the sources 3040a, drains 3040b and channels 3040c of TFTs. Gate insulator layer 3030 is provided to isolate the active layer 3040 and a gate electrode 3050. In the present embodiment, a layer including the gate electrode 3050 is referred to as M1 layer. The select lines are also formed in the M1 layer. An interlayer dielectric 3080 is provided on the M1 layer. A M2 layer is provided on the interlayer dielectric 3080. The source electrode 3060, drain electrode 3070, a first plate 3160 of the capacitor 1340 in FIG. 13 and the data lines 1200 in FIG. 13 are formed in the M2 layer. The source electrode 3060 is connected to the source 3040a in the active layer 3040 via a through hole. The drain electrode 3070 is connected to the drain 304b in the active layer 3040 via another through hole. A passivation layer 3090 is provided on the M2 layer and the interlayer dielectric 3080. A M3 layer is provided on the passivation layer 3090. A second plate 3150 of the capacitor 1340 is in the M3 layer. A planarization layer 3100 is on the M3 layer and the passivation layer 3090, and the planarization layer 3100 may be formed of organic material. The anode 3120 is formed on the planarization layer 3100, and is connected to the drain electrode 3070 of the second TFT 1330 via a through hole. The pixel defining layer (PDL) 3110 is used for defining the region of each pixel unit. The pixel defining layer 3110 is formed of insulating material. The emissive layer 3130 is disposed between the anode 3120 and the cathode 3140. The cathode 3140 (also referred to as the top electrode) may substantially occupy all the active area 1000. The emissive layer 3130 in each pixel unit contacts the cathode 3140. In some embodiments, the gate electrode 3050 may be disposed below the active layer 3040, accordingly the M1 layer is between the substrate 3010 and the active layer 3040 and the gate insulator layer 3030 is disposed between the active layer 3040 and the gate electrode 3050.

Figure 15:
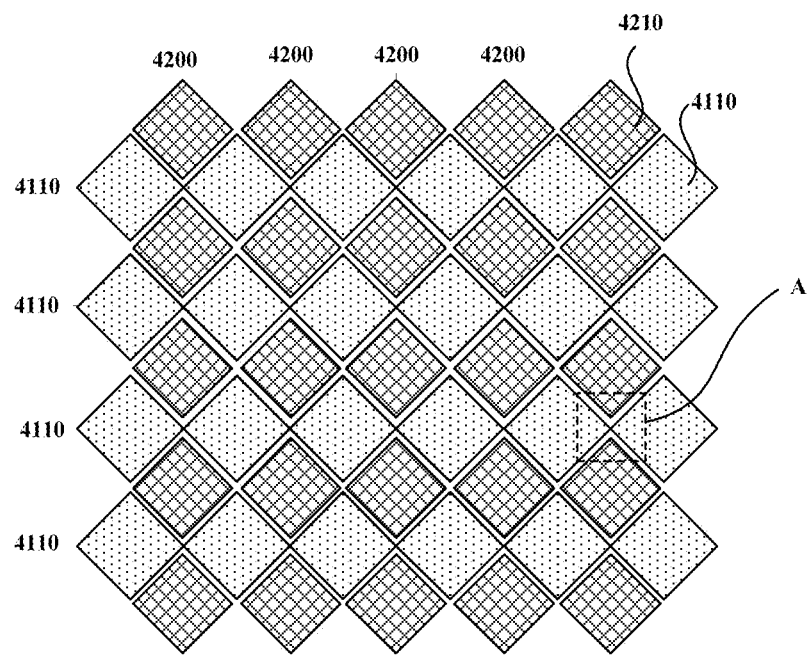
FIG. 15 is a schematic diagram showing a segmented cathode of an AMOLED panel according to an embodiment of the present disclosure.

The cathode layer 3140 is patterned to a plurality of electrodes. FIG. 15 is a schematic diagram showing a fraction of the cathode layer in an AMOLED panel according to an embodiment of the present disclosure. As shown, the cathode 3140 is patterned into a plurality of rows 4100 and a plurality of columns 4200 insulated from the plurality of rows 4100. Each row 4100 includes a plurality of first electrodes 4110 and each column 4200 includes a plurality of second electrodes 4210. In the present embodiment, both the first electrode 4110 and the second electrode 4210 are diamond-shaped. All rows 4100 are insulated from each other, and all columns 4200 are also insulated from each other. Adjacent first electrodes 4110 in the same row 4100 are directly connected with each other in a plane where the cathode layer 3140 resides. Adjacent second electrodes 4210 in the same column 4200 are separated in the plane where the cathode layer 3140 resides but are electrically connected by a connection route in a different layer.

Figure 16:
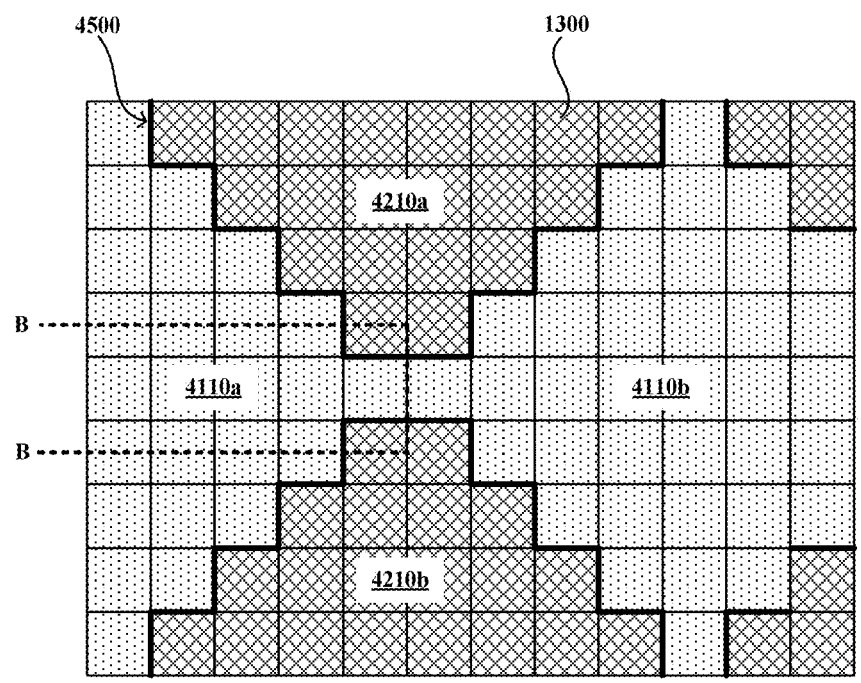
FIG. 16 is an enlarged view of an area A of FIG. 15.

FIG. 16 is an enlarged view of an area A of FIG. 15. In the present embodiment, the size of each first electrode (second electrode) is larger than the size of a pixel unit. Generally, an AMOLED panel is defined into a number of pixel units 1300 at the pixel defining layer 3110. Each first electrode (or second electrode) corresponds to multiple pixel units. The adjacent first electrode 4110 and the second electrode 4210 are separated by slits 4500. In the present embodiment, the slits 4500 extend substantially in accordance with boundaries of pixel units 1300. As illustrated in FIG. 16, adjacent first electrodes 4110a and 4110b in the same row 4100 are directly connected, while adjacent second electrodes 4210a and 4210b in the same column are separated in the plane where the cathode layer 3140 resides and they are electrically connected by the connection route.

Figure 17A:
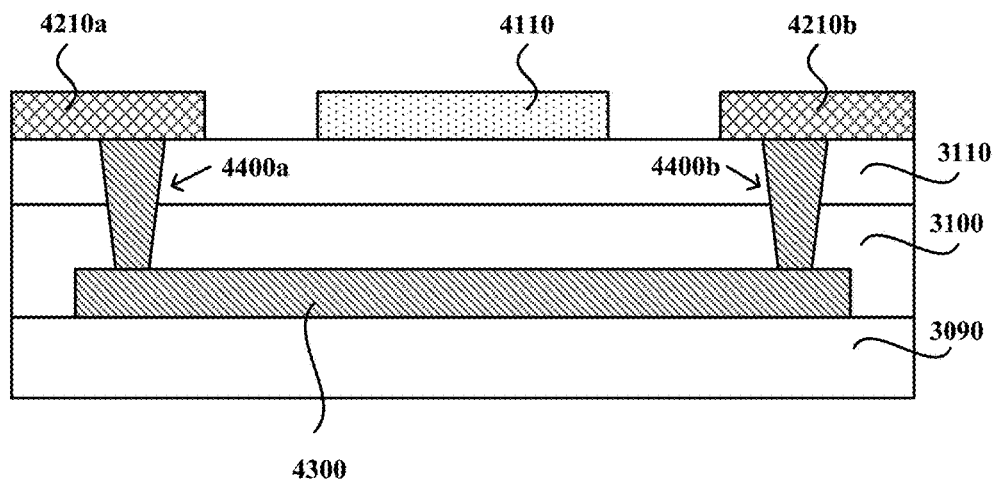
FIG. 17a is a schematic diagram showing a cross-sectional view of an AMOLED panel taken along line A-A of FIG. 16 according to an embodiment of the present disclosure.

FIG. 17a is a schematic diagram showing a cross-sectional view of an AMOLED panel taken along line B-B of FIG. 16 according to an embodiment of the present disclosure. The connection route for adjacent second electrodes 4210a and 4210b in the same column is illustrated in FIG. 17a. A conductive line 4300 is provided in the M3 layer, formed between the passivation layer 3090 and the planarization layer 3100. The second electrode 4210a is connected to the conductive line 4300 by a first conductive plug 4400a which penetrates the pixel defining layer 3110 and the planarization layer 3100. The adjacent second electrode 4210b is connected to the conductive line 4300 by a second conductive plug 4400a which penetrates the pixel defining layer 3110 and the planarization layer 3100. Thus, the two adjacent second electrodes are electrically connected. By means of the connection routes, all second electrodes in the same row may be electrically connected. In some embodiments, the conductive line 4300 and the second plate of the capacitor 1340 are simultaneously formed, that is, the conductive line 4300 and the second plate of the capacitor 1340 are formed in one deposition process during manufacturing the AMOLED panel.

Figure 17B:
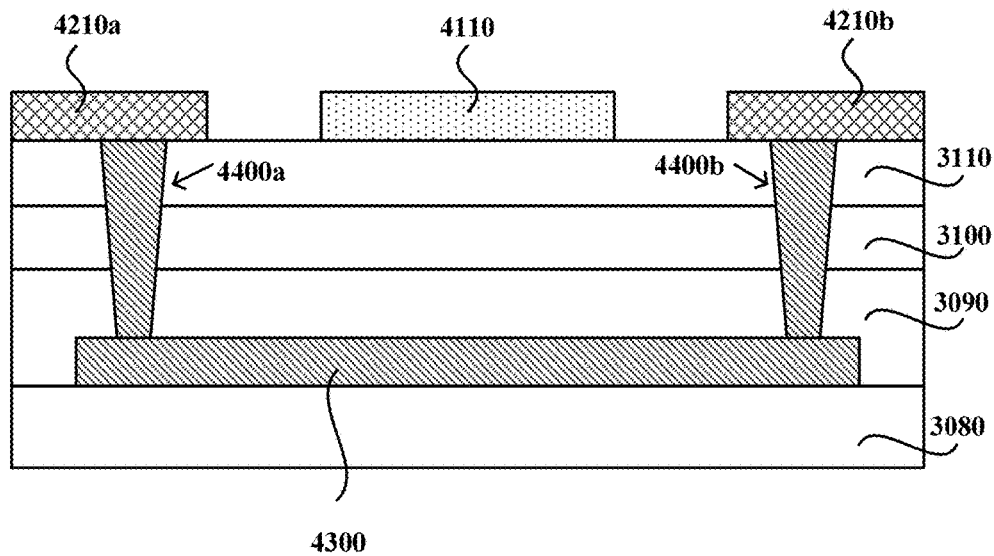
FIG. 17b is a schematic diagram showing a cross-sectional view of an AMOLED panel taken along line A-A of FIG. 16 according to an embodiment of the present disclosure.

FIG. 17b illustrates an alternative implementation of the connection route. In an embodiment of the present disclosure, the conductive line 4300 is formed in the M2 layer (that is, between the interlayer dielectric 3080 and the passivation layer 3090). The second electrode 4210a is connected to the conductive line 4300 by the first conductive plug 4400a which penetrates the pixel defining layer 3110, the planarization layer 3100 and the passivation layer 3090. The adjacent second electrode 4210b is connected to the conductive line 4300 by the second conductive plug 4400a which penetrates the pixel defining layer 3110, the planarization layer 3100 and the passivation layer 3090. In some embodiments, the conductive line 4300, the source electrode 3060 and the drain electrode 3070 are simultaneously formed, that is, the conductive line 4300 the source electrode 3060 and the drain electrode 3070 are formed in one deposition process during manufacturing the AMOLED panel.

Figure 17C:
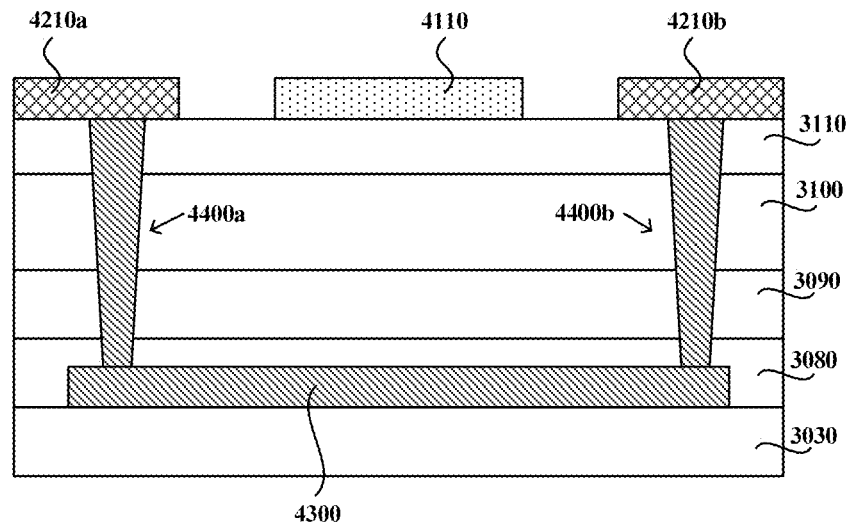
FIG. 17c is a schematic diagram showing a cross-sectional view of an AMOLED panel taken along line A-A of FIG. 16 according to an embodiment of the present disclosure.

FIG. 17c illustrates an alternative implementation of the connection route. In an embodiment of the present disclosure, the conductive line 4300 is formed in the M1 layer (that is, between the interlayer dielectric 3080 and the gate insulator layer 3030). The second electrode 4210a is connected to the conductive line 4300 by the first conductive plug 4400a which penetrates the pixel defining layer 3110, the planarization layer 3100, the passivation layer 3090 and the interlayer dielectric 3080. The adjacent second electrode 4210b is connected to the conductive line 4300 by the second conductive plug 4400a which penetrates the pixel defining layer 3110, the planarization layer 3100, the passivation layer 3090 and the interlayer dielectric 3080. In some embodiments, the conductive line 4300, and the gate electrode 3050 are simultaneously formed, that is, the conductive line 4300 and the gate electrode 3050 are formed in one deposition process during manufacturing the AMOLED panel.

According to embodiments of the present disclosure, the segmented cathode of the AMOLED panel may be used for touch detection. In an embodiment, the rows 4100 are used as driving lines and the columns 4200 are used as sensing lines. A first electrode 4110 and its adjacent second electrode 4120 collectively make up a fringe capacitor that is used for sensing the proximity of an external conductive object such as a finger of a user or a stylus. A driving circuit sends stimulating signals to the rows 4100 sequentially, and a detecting circuit receives sensing signals from each column 4200. In another embodiment, the columns 4200 are used as driving lines and the rows 4100 are used as sensing lines.

In some embodiments of the present disclosure, the operation of the AMOLED panel has a display mode and a touch detection mode. In the display mode, all the rows 4100 and column 4200 are connected to GND (or VDD). In the touch detection mode, the rows 4100 and column 4200 are disconnected from GND (or VDD), the rows 4100 are connected to the driving circuit and the columns are connected to the detecting circuit.

Figure 18:
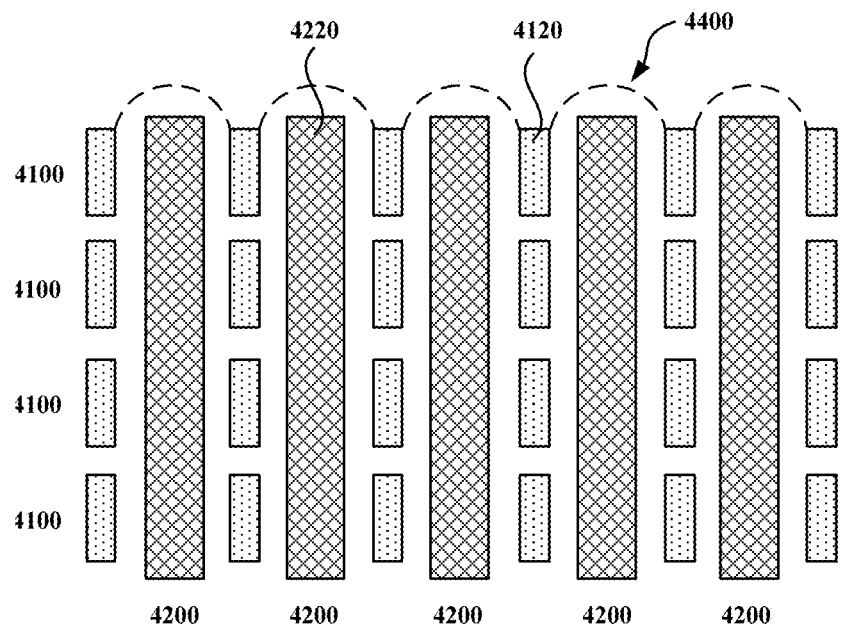
FIG. 18 is a schematic diagram showing a cathode of an AMOLED panel according to an embodiment of the present disclosure.

FIG. 18 illustrates another segmented cathode of an AMOLED panel according to an embodiment of the present disclosure. The cathode is patterned into a plurality of rows 4100 and a plurality of columns 4200. Each row 4100 includes a plurality of separated third electrodes 4120. Each column 4200 includes one fourth electrode 4220 disposed between two adjacent third electrodes 4120 in a same row. Any two adjacent third electrodes in a same row are electrically connected by a connection route 4400. The implementations of the connection route 4400 are described in FIGS. 17a-17c.

In addition, in this specification, various embodiments are described by way of progressive manner, and each of the embodiments focuses on the difference with the other embodiments in terms of the illustration, and the same or similar parts between the various embodiments may refer to each other. Furthermore, the accompanying drawings are shown in a very simplified form and uses imprecise ratio, only for the purpose of being convenient and clear to the auxiliary illustration of the various embodiments of the present invention.

The above disclosed embodiments are described for implementing or using the present invention by those skilled in the art. It will be apparent that various modifications can be made to these embodiments by those skilled in the art, and the general principles defined herein can be implemented in other embodiments without departing from the sprint or the scope of the invention. Therefore, the present invention is not limited by the embodiments shown herein, rather conforms to the broadest range in accordance with the principles and novelty characteristics disclosed.

What is claimed is:

1. An Active Matrix Organic Light Emitting Diode (AMOLED) panel, comprising:
   a substrate;
   a thin film transistor (TFT) on the substrate, wherein the TFT has an active layer, a gate electrode, a source electrode and a drain electrode;

a capacitor, wherein the capacitor has a first plate and a second plate, and wherein the first plate of the capacitor, the source electrode and the drain electrode of the TFT are arranged at a same layer;

an anode layer above the second plate of the capacitor;

a light-emitting layer above and in contact with the anode layer;

a cathode layer above and in contact with the light-emitting layer, wherein the cathode layer is patterned into rows of first electrodes and columns of second electrodes, two adjacent ones of the first electrodes in the a same row are electrically connected with each other in one layer, and two adjacent ones of the second electrodes in a same column are electrically connected to a conductive line arranged to be in a different layer than the cathode layer via plugs; and wherein the gate electrode is arranged at a first layer above the active layer, wherein the first plate of the capacitor, the source electrode and the drain electrode of the TFT are arranged at a second layer above the first layer; wherein the second plate of the capacitor is arranged at a third layer above the second layer; and wherein the conductive line is arranged at the first, second or third layer.

2. The AMOLED panel of claim 1, wherein the conductive line extends in a column direction.

3. The AMOLED panel of claim 1, further comprising: a planarization layer and a pixel defining layer, wherein the planarization layer directly covers the second plate of the capacitor; wherein the anode layer is directly on the planarization layer; wherein the pixel defining layer directly covers the anode layer and has an opening exposing the anode layer.

4. The AMOLED panel of claim 1, wherein the conductive line is in a same layer as the gate electrode of the TFT.

5. The AMOLED panel of claim 4, wherein the rows of first electrodes receive stimulating signals sequentially along a column direction and the columns generate sensing signals for detecting proximity of an external conductive object.

6. The AMOLED panel of claim 1, wherein the conductive line is in a same layer as the source electrode of the TFT.

7. The AMOLED panel of claim 6, wherein the rows of first electrodes receive stimulating signals sequentially along a column direction and the columns generate sensing signals for detecting proximity of an external conductive object.

8. The AMOLED panel of claim 1, wherein the conductive line is in a same layer as the first plate of the capacitor.

9. The AMOLED panel of claim 8, wherein the rows of first electrodes receive stimulating signals sequentially along a column direction and wherein the columns generate sensing signals for detecting proximity of an external conductive object.

10. The AMOLED panel of claim 1, wherein the rows of first electrodes receive stimulating signals sequentially along a column direction and wherein the columns generate sensing signals for detecting proximity of an external conductive object.

11. The AMOLED panel of claim 5, wherein the AMOLED panel operates in a display mode and a touch detection mode, wherein in the display mode, all of the rows of the first electrodes and columns of the second electrodes are electrically connected to a voltage line, and wherein in the touch detection mode, the rows of the first electrodes receive stimulating signals sequentially along the column direction and the columns of second electrodes generate sensing signals for detecting proximity of an external conductive object.

12. The AMOLED panel of claim 10, wherein the AMOLED panel operates in a display mode and a touch detection mode, wherein in the display mode, all of the rows of the first electrodes and the columns of the second electrodes are electrically connected to a voltage line, and wherein in the touch detection mode, the columns of second electrodes receive stimulating signals sequentially in a row direction and the rows of first electrodes generate sensing signals for detecting proximity of an external conductive object.

13. The AMOLED panel of claim 1, wherein each of the first electrodes is polygon-shaped, and each of the second electrodes is polygon-shaped.

14. The AMOLED panel of claim 13, wherein each of the first electrodes is diamond-shaped, and each of the second electrodes is diamond-shaped.

15. The AMOLED panel of claim 13, wherein each of the first electrodes is rectangle-shaped, and each of the second electrodes is rectangle-shaped.

16. A method of driving an AMOLED panel, wherein the AMOLED panel comprises a substrate;

a thin film transistor (TFT) on the substrate, wherein the TFT has an active layer, a gate electrode, a source electrode and a drain electrode;

a capacitor, wherein the capacitor has a first plate and a second plate, and wherein the first plate of the capacitor, the source electrode and the drain electrode of the TFT are arranged at a same layer;

an anode layer above the second plate of the capacitor;

a light-emitting layer above and in contact with the anode layer;

a cathode layer above and in contact with the light-emitting layer, wherein the cathode layer is patterned into rows of first electrodes and columns of second electrodes, two adjacent ones of the first electrodes in a same row are electrically connected with each other in one layer, and two adjacent ones of the second electrodes in a same column are electrically connected to a conductive line arranged to be in a different layer than the cathode layer via plugs, the method comprising:

electrically connecting all of the rows of the first electrodes and the columns of the second electrodes to a reference voltage; and disconnecting all of the rows of the first electrodes and the columns of the second electrodes from the reference voltage, and sending stimulating signals to the rows of the first electrodes sequentially along a column direction, and receiving sensing signals from each column of the second electrodes in a touch mode; and wherein the gate electrode is arranged at a first layer above the active layer, wherein the first plate of the capacitor, the source electrode and the drain electrode of the TFT are arranged at a second layer above the first layer; wherein the second plate of the capacitor is arranged at a third layer above the second layer; and wherein the conductive line is arranged at the first, second or third layer.

17. The method of claim 16, wherein the reference voltage is ground (GND).

18. The method of claim 16, wherein the reference voltage is supply voltage (VDD).

* * * * *